US012811595B2

(12) United States Patent
Maccarrone et al.

(10) Patent No.: US 12,811,595 B2
(45) **Date of Patent: *Nov. 24, 2026**

(54) DIGITAL-TO-ANALOG CONVERTER CIRCUIT

(71) Applicant: STMicroelectronics S.r.l., Agrate Brianza (IT)

(72) Inventors: Agatino Massimo Maccarrone, Regalbuto (IT); Antonino Conte, Tremestieri Etneo (IT); Francesco Tomaiuolo, Acireale (IT); Michelangelo Pisasale, Catania (IT); Marco Ruta, San Gregorio di Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 40 days.

This patent is subject to a terminal disclaimer.

(21) Appl. No.: 18/824,653

(22) Filed: Sep. 4, 2024

(65) Prior Publication Data

US 2024/0429928 A1 Dec. 26, 2024

Related U.S. Application Data

(63) Continuation of application No. 18/054,333, filed on Nov. 10, 2022, now Pat. No. 12,107,591.

(30) Foreign Application Priority Data

Nov. 29, 2021 (IT) ........................ 102021000030134

(51) Int. Cl.
*H03M 1/06* (2006.01)

(52) U.S. Cl.
CPC ................................ *H03M 1/0604* (2013.01)

(58) Field of Classification Search
CPC .......... H03M 1/06; H03M 1/78; H03M 1/089; H03M 1/0604; H03M 1/745
See application file for complete search history.

(56) References Cited

U.S. PATENT DOCUMENTS 5,451,889 A * 9/1995 Heim ............... H03K 19/00315 327/534
6,885,239 B2 * 4/2005 Otaka ..................... G05F 3/205 327/543

(Continued)

FOREIGN PATENT DOCUMENTS

CN 104765405 A 1/2014
CN 106527574 A 9/2015
CN 213424593 U 6/2021

OTHER PUBLICATIONS

Bult, Klaas et al., "An Inherently Linear and Compact MOST-Only Current Division Technique", IEEE Journal of Solid-State Circuits, vol. 21, No. 12, Dec. 1992, 7 pages.

(Continued)

*Primary Examiner* — Lam T Mai
(74) *Attorney, Agent, or Firm* — Slater Matsil, LLP

(57) ABSTRACT

In accordance with an embodiment, a digital-to-analog converter (DAC) includes: a W-2W current mirror comprising a first plurality of MOS transistors and a second plurality of MOS transistors, wherein ones of the second plurality of MOS transistors are coupled between adjacent ones of the first plurality of MOS transistors; and a bulk bias generator having a plurality of output nodes coupled to corresponding bulk nodes of the first plurality of MOS transistors, wherein the plurality of output nodes are configured to provide voltages that are inversely proportional to temperature.

20 Claims, 4 Drawing Sheets

(56) References Cited

U.S. PATENT DOCUMENTS

| | | | | |
|---|---|---|---|---|
| 7,388,531 | B1 * | 6/2008 | Cyrusian | H03M 1/0604 341/144 |
| 7,701,377 | B1 * | 4/2010 | Cyrusian | H03M 1/0604 341/163 |
| 8,058,922 | B2 * | 11/2011 | Cassia | H03K 17/102 327/382 |
| 8,723,712 | B1 * | 5/2014 | Kabir | H03M 1/661 327/108 |
| 9,343,961 | B1 * | 5/2016 | Lipka | H02M 3/07 |
| 11,094,388 | B1 * | 8/2021 | Park | G11C 17/16 |
| 11,276,461 | B1 * | 3/2022 | Cariello | G11C 16/349 |
| 12,107,591 | B2 * | 10/2024 | Maccarrone | H03M 1/0604 |
| 2004/0070441 | A1 * | 4/2004 | Bringivijayaraghavan | H03K 17/063 327/534 |
| 2004/0232972 | A1 * | 11/2004 | Yang | G05F 3/262 341/144 |
| 2005/0046407 | A1 * | 3/2005 | Lin | G05F 3/267 323/313 |
| 2008/0284493 | A1 * | 11/2008 | Baek | G05F 3/30 327/513 |
| 2009/0113358 | A1 * | 4/2009 | Goodnow | G06F 30/36 716/136 |
| 2009/0201080 | A1 * | 8/2009 | Imai | G05F 3/262 327/543 |
| 2009/0284304 | A1 * | 11/2009 | Conte | G05F 3/30 327/539 |
| 2010/0141496 | A1 * | 6/2010 | Takiguchi | H03M 1/0604 341/144 |
| 2010/0149884 | A1 * | 6/2010 | Kumar | G11C 5/147 365/189.09 |
| 2011/0227653 | A1 * | 9/2011 | Degoirat | H03H 11/245 330/288 |
| 2012/0139643 | A1 * | 6/2012 | Scott | H03F 1/0272 330/296 |
| 2014/0333367 | A1 * | 11/2014 | Coimbra | G01R 15/04 327/437 |
| 2016/0173036 | A1 * | 6/2016 | Vogt | H03F 1/0205 330/261 |
| 2019/0140656 | A1 | 5/2019 | Downey | |
| 2020/0136577 | A1 * | 4/2020 | Ivanov | H03F 3/45192 |
| 2021/0021269 | A1 * | 1/2021 | Tranca | G01R 19/0046 |
| 2021/0067114 | A1 * | 3/2021 | Ivanov | H03F 3/45179 |
| 2022/0044752 | A1 * | 2/2022 | Kim | G11C 29/021 |
| 2022/0057956 | A1 * | 2/2022 | Liang | G06F 3/0604 |
| 2022/0188242 | A1 * | 6/2022 | Tanpairoj | G06F 12/0246 |
| 2023/0353107 | A1 * | 11/2023 | Sakurai | H03F 1/301 |

OTHER PUBLICATIONS

Gupta, Shantanu Sen et al., "W-2W Current Steering DAC for Programming Phase Change Memory", IEEE Workshop on Microelectronics and Electron Devices, Apr. 3, 2009, 4 pages.

Raby, Spencer, "A CMOS Sub-threshold W-2W Current mode Digital-to-Analog Converter", University of Tennessee, Knoxville, US, TRACE: Tennessee Research and Creative Exchange, Masters Theses, Dec. 2019, 93 pages.

* cited by examiner

DIGITAL-TO-ANALOG CONVERTER CIRCUIT

CROSS-REFERENCE TO RELATED APPLICATIONS

This application is a continuation of U.S. patent application Ser. No. 18/054,333, filed Nov. 10, 2022, which application claims the benefit of Italian Patent Application No. 102021000030134, filed on Nov. 29, 2021, which applications are hereby incorporated herein by reference.

TECHNICAL FIELD

The description relates to current-steering digital-to-analog converters (IDACs) that may be applied, for instance, to memory devices such as phase-change memory (PCM) devices, and/or general purpose microcontrollers (GP MCUs).

BACKGROUND

Phase-change memory is a type of non-volatile memory (NVM), particularly a type of non-volatile random-access memory (RAM). The material of a conventional phase-change memory cell is typically a chalcogenide alloy comprising Germanium (Ge), Antimony (Sb) and Tellurium (Te), called GST (e.g., having composition Ge2Sb2Te5). The chalcogenide alloy is able to change phase (crystalline or amorphous) in a reversible and controlled way by means of a programming current that passes through the memory cell and induces the phase change by appropriately heating the chalcogenide alloy (i.e., the memory storage element).

Conventionally, heat produced by the passage of the programming current is used to either quickly heat and quench the alloy, making it amorphous (RESET state and RESET programming current pulse), or to hold the alloy in its crystallization temperature range for some time, thereby switching it to a (poly) crystalline state (SET state and SET programming current pulse). The use of two different phases of the chalcogenide alloy in a memory cell is based on the recognition that the crystalline phase has a low electrical resistance (e.g., by convention corresponding to logic 1 or SET state) and the amorphous phase has a high electrical resistance (e.g., by convention corresponding to logic 0 or RESET state).

Therefore, the SET and RESET operations of a memory cell in a phase-change memory are used to change the content of the cell from "o" to "1" and vice versa, by applying a controlled programming current with a defined shape to allow the memory storage element to change its state from non-conducting (having a high electrical resistance) to conducting (having a low electrical resistance) and vice versa, by changing its morphology from amorphous to (poly) crystalline and vice versa.

During the SET and RESET pulses, the programming current through the memory cell is expected to have a defined time behavior (e.g., a defined shape of the SET and/or RESET current pulses) so as to produce a controlled variation of the temperature of the memory storage element. For instance, FIG. 1 is a waveform diagram exemplary of the expected behavior of the programming current ICELL of a phase-change memory cell during the SET pulse, which is expected to produce a constant variation of the temperature gradient and allow the memory storage element to switch to a polycrystalline state. The programming current ICELL during the SET pulse is expected to increase rapidly from zero to a plateau value $I_1$, maintain the value $I_1$ for a time interval t1P, and then slowly return (e.g., fall) to zero during a time interval $t_{1F}$ with a constant decrease rate (e.g., linearly). Therefore, a driver circuit is conventionally used to inject the desired current in the memory storage element, starting from a reference current generated by a current-steering digital-to-analog converter.

Current-steering digital-to-analog converters according to a "W-2W" architecture are conventionally used in such applications, since they occupy a small silicon area. Document Gupta, Shantanu Sen et al., "W-2W Current Steering DAC for Programming Phase Change Memory", 2009 IEEE Workshop on Microelectronics and Electron Devices (2009): 1-4, is exemplary of such conventional approach.

However, due to their topology, W-2W IDAC circuits may suffer from a systematic error affecting some transistors of the architecture, and may thus fail to produce an output current pulse having the correct shape expected during a SET pulse (i.e., linearly decreasing).

Therefore, there is a need in the art to provide improved W-2W current-steering digital-to-analog converters able to produce output current pulses with the desired shape and linearity.

SUMMARY

In one or more embodiments, a circuit comprises a diode-connected MOS transistor having a drain terminal connected to an input node and source terminal connected to a reference voltage node. The diode-connected MOS transistor is configured to pass a reference current from the input node to the reference voltage node. A plurality of ordered mirroring MOS transistors have respective gate terminals connected to a gate terminal of the diode-connected MOS transistor and respective drain terminals alternatively couplable either to a first current node or to a second current node as a function of a plurality of respective ordered control signals. A first mirroring MOS transistor in the plurality of ordered mirroring MOS transistors has a source terminal directly connected to the reference voltage node. A plurality of current control MOS transistors have respective gate terminals connected to the gate terminal of the diode-connected MOS transistor, and each current control MOS transistor is arranged between the source terminals of two consecutive mirroring MOS transistors in the plurality of mirroring MOS transistors. The diode-connected MOS transistor and the mirroring MOS transistors all have the same channel dimensions, and the current control MOS transistors all have the same channel dimensions. The channel of the current control MOS transistors has the same length and twice the width of the channel of the diode-connected MOS transistor. The mirroring MOS transistors whose source terminal is not directly connected to the reference voltage node have respective bulk terminals configured to receive one or more compensation signals having respective values that decrease with increasing temperature.

One or more embodiments may thus facilitate compensating the body effect of the mirroring MOS transistors in a W-2W current-steering digital-to-analog converter.

In one or more embodiments, the one or more compensation signals are linearly dependent on temperature.

In one or more embodiments, the circuit comprises a compensation circuit configured to produce the one or more compensation signals. The compensation circuit comprises a proportional-to-absolute-temperature current generator arrangement configured to produce a compensation voltage signal that decreases linearly as a function of increasing temperature; a voltage divider circuit; and a buffer stage configured to supply the compensation voltage signal to the voltage divider circuit. The one or more compensation signals are produced at one or more intermediate nodes of the voltage divider circuit.

In one or more embodiments, the proportional-to-absolute-temperature current generator arrangement comprises a first p-channel MOS transistor and a first n-channel MOS transistor arranged in series between a supply voltage node and the reference voltage node; and a second p-channel MOS transistor and a second n-channel MOS transistor arranged in series between the supply voltage node and the reference voltage node. The first n-channel MOS transistor has a source terminal coupled to the reference voltage node, a drain terminal coupled to a drain terminal of the first p-channel MOS transistor, and a gate terminal configured to receive a bandgap reference voltage. The first p-channel MOS transistor has a source terminal coupled to the supply voltage node and a gate terminal coupled to its drain terminal. The second p-channel MOS transistor has a source terminal coupled to the supply voltage node, a drain terminal coupled to a drain terminal of the second n-channel MOS transistor, and a gate terminal coupled to the gate terminal of the first p-channel MOS transistor. The second n-channel MOS transistor has a source terminal coupled to the reference voltage node and a gate terminal coupled to its drain terminal. The compensation voltage signal is produced at the gate terminal of the second n-channel MOS transistor.

In one or more embodiments, the buffer stage comprises an amplifier circuit having an output terminal coupled to the voltage divider circuit, a non-inverting input terminal configured to receive the compensation voltage signal, and an inverting input terminal coupled to its output terminal.

In one or more embodiments, the mirroring MOS transistors whose source terminal is not directly connected to the reference voltage node may include (e.g., consist of) triple-well n-channel MOS transistors.

In one or more embodiments, a source terminal of a last mirroring MOS transistor in the plurality of ordered mirroring MOS transistors is directly connected to a source terminal of a second-to-last mirroring MOS transistor in the plurality of ordered mirroring MOS transistors.

In one or more embodiments, the last mirroring MOS transistor and the second-to-last mirroring MOS transistor have respective bulk terminals configured to receive a same compensation signal.

In one or more embodiments, a drain terminal of a last mirroring MOS transistor in the plurality of ordered mirroring MOS transistors and a drain terminal of a second-to-last mirroring MOS transistor in the plurality of ordered mirroring MOS transistors are steadily coupled to the second current node.

In one or more embodiments, the drain terminals of the plurality of ordered mirroring MOS transistors are alternatively couplable to the first current node or to the second current node via respective switches activatable as a function of the respective ordered control signals.

In one or more embodiments, the diode-connected MOS transistor, the plurality of mirroring MOS transistors and the plurality of current control MOS transistors include (e.g., consist of) n-channel transistors.

In one or more embodiments, the circuit comprises a first output diode-connected MOS transistor having a drain terminal connected to the first current node and source terminal connected to a supply voltage node, and a second output diode-connected MOS transistor having a drain terminal connected to the second current node and a source terminal connected to the supply voltage node.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular configurations, structures, or characteristics may be combined in any adequate way in one or more embodiments.

The headings/references used herein are provided merely for convenience and hence do not define the extent of protection or the scope of the embodiments.

Throughout the figures annexed herein, unless the context indicates otherwise, like parts or elements are indicated with like references/numerals and a corresponding description will not be repeated for the sake of brevity.

Some embodiments of the present invention are directed to improved current-steering digital-to-analog converters according to a W-2W architecture. Such current-steering digital-to-analog converters may be applied, for instance, to memory devices such as phase-change memory (PCM) devices, and/or general purpose microcontrollers (GP MCUs).

Figure 2:
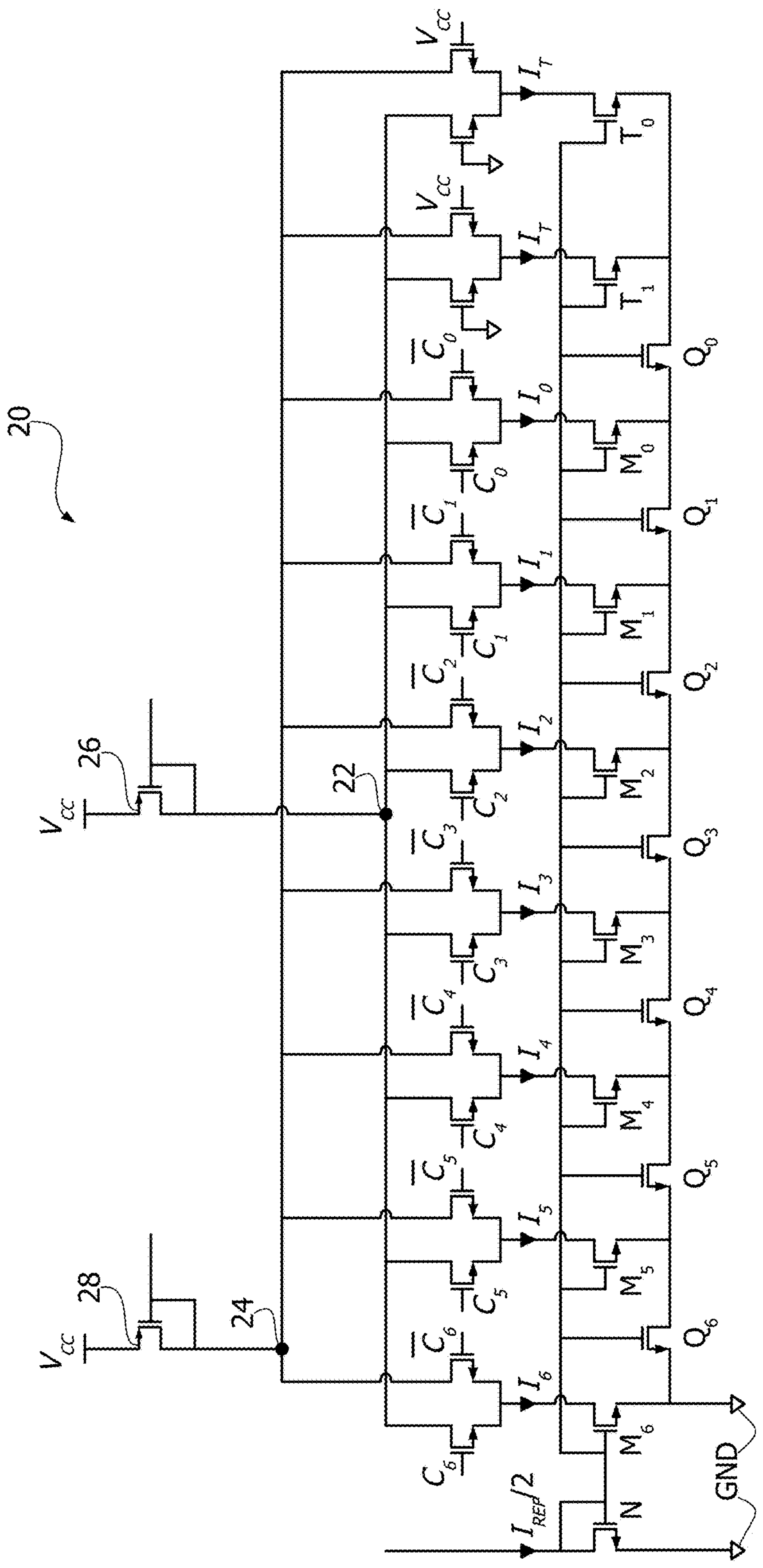
FIG. 2 is a circuit diagram exemplary of a current-steering digital-to-analog converter (IDAC) based on a W-2W current mirror architecture.

By way of introduction to the detailed description of exemplary embodiments, reference may first be made to FIG. 2, which is a circuit diagram exemplary of a 7-bit current-steering digital-to-analog converter (IDAC) 20 based on the W-2W current mirror architecture known, for instance, from document Gupta et al. previously cited.

A W-2W current mirror may be used to implement a binary-weighted current-steering DAC for use, e.g., as the write driver circuit for programming a phase-change memory. It relies on the recognition that if two metal-oxide-semiconductor field-effect transistors (MOSFETs) with the same width-to-length ratio (briefly, W/L) are connected in parallel, they behave as an equivalent transistor of size 2 W/L, while if connected in series they behave as an equivalent transistor of size W/2L.

A W-2W IDAC circuit 20 comprises a diode-connected master transistor N (e.g., an n-channel MOS transistor) having a drain terminal configured to receive a current $I_{REF}/2$ and a source terminal coupled to a reference voltage node GND (or local ground). Transistor N is arranged to pass a current $I_{REF}/2$, with current $I_{REF}$ possibly being equal to 64 HA. The W-2W IDAC circuit 20 comprises a set of slave transistors $T_0$, $T_1$, $M_0$, . . . , $M_6$ (e.g., n-channel MOS transistors) having respective gate terminals connected to the gate terminal of the master transistor N, so that the gate voltage of the master transistor N is supplied to the gate terminals of each of the slave transistors $T_0$, $T_1$, $M_0$, . . . , $M_6$. The master transistor N and the slave transistors $T_0$, $T_1$, $M_0$, . . . , $M_6$ all have the same channel size (e.g., the same width-to-length ratio W/L, possibly with the same width W and the same length L). The source terminal of a first slave transistor $M_6$ is connected directly to the reference voltage node GND, so that transistor $M_6$ passes a current $I_6$ that is the same as current $I_{REF}/2$ passed by the master transistor N ($I_6=I_{REF}/2$). The source terminal of a second slave transistor $M_5$ is connected to the source terminal of the first slave transistor $M_6$ (e.g., to the reference voltage node GND) via a first current control transistor $Q_6$. The source terminal of a third slave transistor $M_4$ is connected to the source terminal of the second slave transistor $M_5$ via a second current control transistor $Q_5$, and so on until the source terminal of a second-to-last (e.g., eight) slave transistor T1 that is connected to the source terminal of a third-to-last (e.g., seventh) slave transistor $M_0$ via a last (e.g., seventh) current control transistor $Q_0$. The current control transistors $Q_6$ to $Q_0$ all have a same channel size, which is twice as wide as the channel of transistors N, $M_6$, . . . , $M_0$, $T_1$, To (e.g., the current control transistors may have the same width-to-length ratio 2*W/L, possibly with the same width 2*W and the same length L). The current control transistors $Q_6$ to $Q_0$ all have their gate terminals connected to the gate terminal of the master transistor N to receive the same gate voltage. The source terminal of a last (e.g., ninth) slave transistor To may be directly connected to the source terminal of the second-to-last slave transistor $T_1$.

In the arrangement exemplified in FIG. 2, the current passing through each of the transistors $M_5$, . . . , $M_0$, $T_1$, To is arranged to pass via transistor $Q_6$. Transistor $Q_6$ seeks to pass a current $I_{REF}/2$, which is provided by way of transistors $M_5$ and $Q_5$. The gate voltages of transistors $M_5$ and $Q_5$ are the same, hence the current is split equally between the two paths that these transistors are in. Consequently, transistor $M_5$ passes a current $I_5=I_{REF}/4$. Similarly, transistor $M_4$ passes a current $I_4=I_{REF}/8$, transistor $M_3$ passes a current $I_3=I_{REF}/16$, transistor $M_2$ passes a current $I_2=I_{REF}/32$, transistor $M_1$ passes a current $I_1=I_{REF}/64$, transistor $M_0$ passes a current $I_0=I_{REF}/128$, and transistors $T_1$ and $T_0$ each pass a current $I_T=I_{REF}/256$.

As exemplified in FIG. 2, the drain terminals of the first seven slave transistors of the current mirror ($M_6$ to $M_0$) can be selectively coupled either to a first node 22 or to a second node 24, via respective switches (e.g., MOS transistors). For instance, the drain terminal of transistor MX (with X ranging from 0 to 6) may be selectively coupled to node 22 via a respective switch activatable by a respective control signal $C_X$ (e.g., the switch being conductive in response to the respective control signal $C_X$ being asserted), and may be selectively coupled to node 24 via a further respective switch activatable by the complement of the respective control signal $C_X$ (e.g., the further switch being conductive in response to the respective control signal $C_X$ being de-asserted, i.e., in response to the complement control signal $\overline{C_X}$ being asserted).

As exemplified in FIG. 2, the drain terminals of transistors $T_0$ and $T_1$ may be always coupled to node 24 via respective always-on switches (e.g., MOS n-channel transistors having their gate terminals coupled to a supply voltage $V_{CC}$). Always-off switches (e.g., MOS n-channel transistors having their gate terminals coupled to the reference voltage node GND) may also be provided between the drain terminals of transistors $T_0$ and $T_1$ and node 22, e.g., to improve the circuit matching.

Control signals $C_0$, . . . , $C_6$ represent the digital input signals of the W-2W IDAC circuit (e.g., with each control signal providing one bit of a 7-bit digital signal C, with $C_0$ being the least significant bit (LSB) and $C_6$ being the most significant bit (MSB)). The analog output signal (e.g., output current) of the W-2W IDAC circuit is provided by a single-ended current flowing through node 22. For instance, the output current may be output from the IDAC circuit 20 via a PMOS current mirror coupled to node 22, as exemplified by the diode-connected p-channel MOS transistor 26 coupled between node 22 and the supply voltage $V_{CC}$. The current path through node 24 (and through the diode-connected p-channel MOS transistor 28 coupled between node 24 and the supply voltage $V_{CC}$) provides a DC current path for transistors $M_5$ to $M_0$ and provides that the current flowing through the IDAC structure is constant, independently from the value of the input digital signals $C_0$, . . . , $C_6$. This also provides that the drain terminals of transistors $M_5$ to $M_0$ are correctly polarized when the input digital signal switches to change the IDAC current value, improving precision and settling time of the IDAC output current.

The provision of transistors $T_0$ and $T_1$ substantially produces an offset in the output current signal, which may advantageously avoid operating at zero output current when the input digital signal C (i.e., the set of control signals $C_0$, . . . , $C_6$) is equal to zero.

In an exemplary 7-bit W-2W IDAC circuit according to the architecture considered herein, the current $I_{0010000}$ (i.e., the output current corresponding to the digital input signal C=0010000) is expected to be equal to $I_{REF}/8$ and is thus expected to be greater than $I_{0001111}=I_{REF}/16+I_{REF}/32+I_{REF}/64+I_{REF}/128$ by a factor $I_{REF}/128$. This would be the case if the source voltage of all slave transistors $M_6$, . . . , $M_0$, $T_1$, To was the same, thereby resulting in the same bulk-source voltage for all the slave transistors. However, due to the presence of transistors $Q_6$, . . . , $Q_0$ and due to the current flowing therein, the source voltage $V_S$ of the slave transistors $M_6$, . . . , $M_0$, $T_1$, To may not be the same. In particular, $V_S$, $T_0=V_S$, $T_1>V_S$, $M_0>V_S$,$M_1>V_S$,$M_2>V_S$,$M_3>V_S$,$M_4>V_S$, $M_5>V_S$,$M_6$. Therefore, the magnitude of the current flowing through transistors $M_5, \ldots, M_0, T_1$, To may be affected by the body effect, resulting from different bulk-source voltages of transistors $M_5, \ldots, M_0, T_1$, To compared to the bulk-source voltage of transistors $M_6$ and N. In particular, the body effect may alter the threshold voltage of transistors $M_5, \ldots, M_0, T_1$, To, and thus the corresponding drain-source currents.

Figure 1:
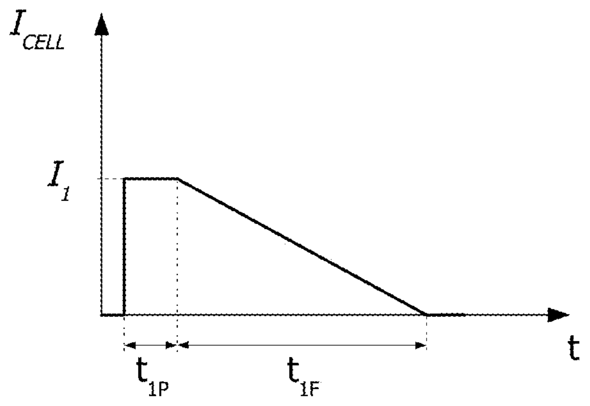
FIG. 1 is a waveform diagram exemplary of the expected behavior of the programming current of a phase-change memory cell during a SET pulse.
Figure 3:
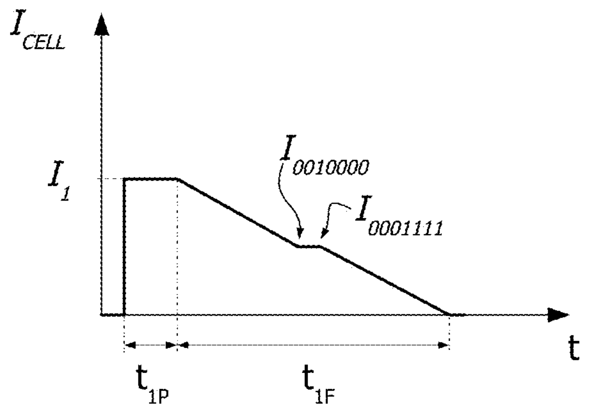
FIG. 3 is a waveform diagram exemplary of the possible behavior of the programming current of a phase-change memory cell during a SET pulse, produced by the DAC circuit of FIG. 2.

For instance, FIG. 3 is a waveform diagram exemplary of a possible behavior (e.g., shape) of the programming current ICELL of a phase-change memory cell during the SET pulse, produced by a W-2W IDAC circuit as exemplified in FIG. 2. During the current falling phase (period $t_{1F}$), there might be unexpected steps (e.g., an increasing portion when passing from C=0010000 to C=0001111) due to the operation of the W-2W IDAC circuit discussed above. This may affect the shape of the programming current ICELL and thus the temperature gradient applied to the memory storage element.

Figure 4:
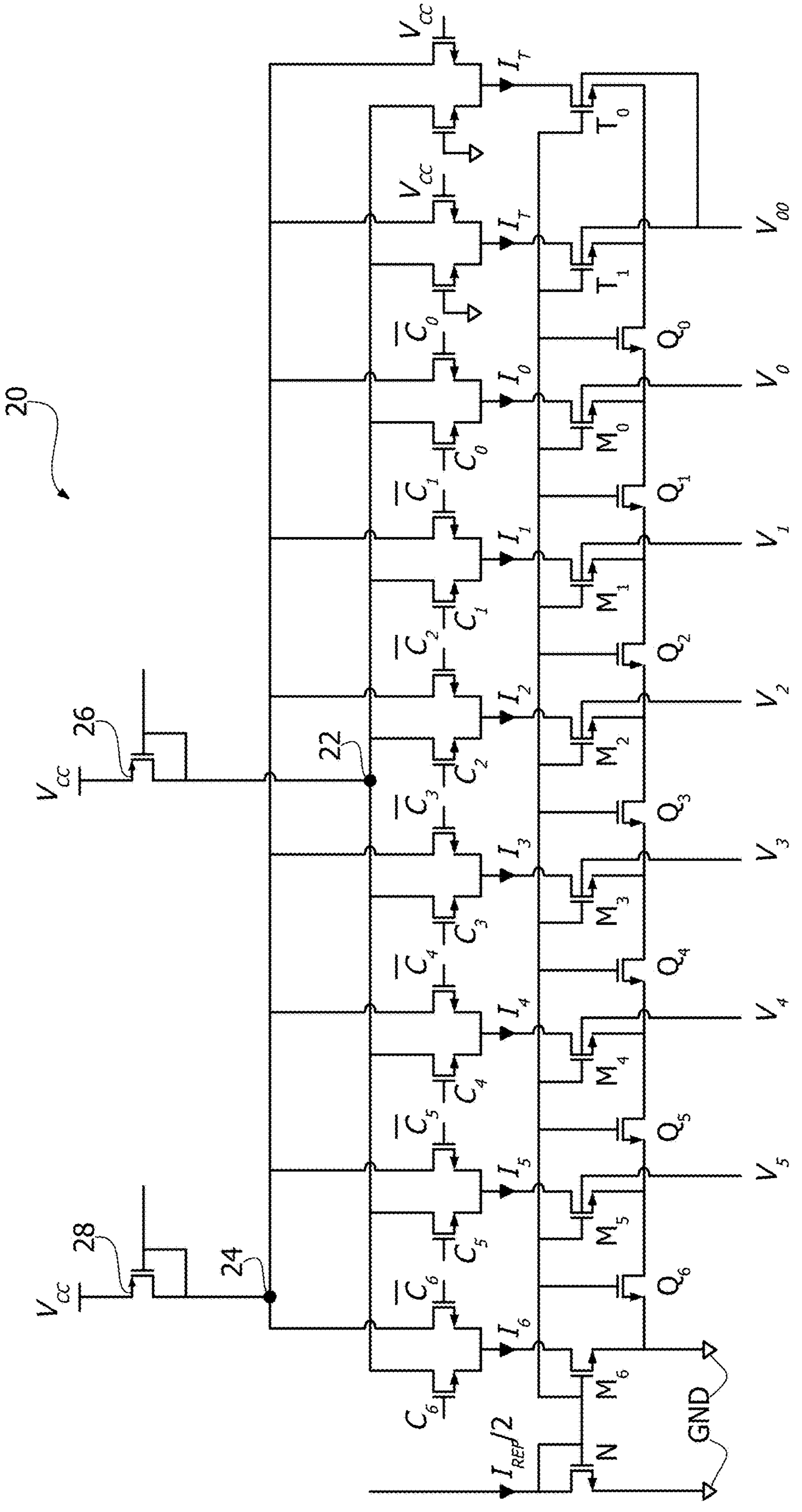
FIG. 4 is a circuit diagram exemplary of a current-steering digital-to-analog converter (IDAC) based on a W-2W current mirror architecture according to one or more embodiments of the present description.

Therefore, in one or more embodiments as exemplified in FIG. 4, the bulk (or body) terminals of the slave transistors $M_5, \ldots, M_0, T_1, T_0$ whose source terminal is not at the same voltage level as the reference voltage node GND (e.g., is not directly connected to the reference voltage node GND) may be controlled by respective compensation signals $V_5, \ldots, V_0, V_{00}$ that facilitate mitigating (e.g., compensating) the body effect. Transistors $T_1$ and $T_0$ may receive the same compensation signal $V_{00}$ at their bulk terminals, since their source terminals are directly coupled one to the other and receive the same voltage (i.e., they may be affected by the body effect to the same extent).

In one or more embodiments, the compensation signals $V_5, \ldots, V_0, V_{00}$ may be different one from the other. In some embodiments, the slave transistors $M_5, \ldots, M_0, T_1$, To may be divided in subsets and each subset may receive the same compensation signal. In some embodiments, the same compensation signal may be provided to all the slave transistors $M_5, \ldots, M_0, T_1, T_0$.

In one or more embodiments, the slave transistors $M_5, \ldots, M_0, T_1$, To may thus be designed so as to provide an accessible and selectively controllable bulk terminal. For instance, in one or more embodiments the slave transistors $M_5, \ldots, M_0, T_1$, To may comprise or consist of triple-well NMOS transistors. In a triple-well NMOS transistor, the P-well of the transistor is embedded within a deep N-well to create an isolated body from the P-substrate. This isolates the body from the substrate and allows biasing the body of the transistor and the deep N-well separately.

In one or more embodiments, the magnitude of the body effect acting on slave transistors $M_5, \ldots, M_0, T_1$, To may depend on temperature. In particular, at high temperature (e.g., 140° C.) the body effect may be almost entirely compensated by the temperature itself, so that the output current produced by the W-2W IDAC circuit 20 has the expected shape. At low temperature (e.g., −40° C.), the body effect may not be compensated and the output current may not have the expected shape, as exemplified in FIG. 3 where a step or knee is produced in the output current when passing from $I_{0010000}$ to $I_{0001111}$. Therefore, in one or more embodiments the compensation signal(s) $V_5, \ldots, V_0, V_{00}$ may have a magnitude that is dependent on temperature, so as to provide strong compensation at low temperatures and mild compensation at high temperatures (e.g., down to zero compensation).

Figure 5:
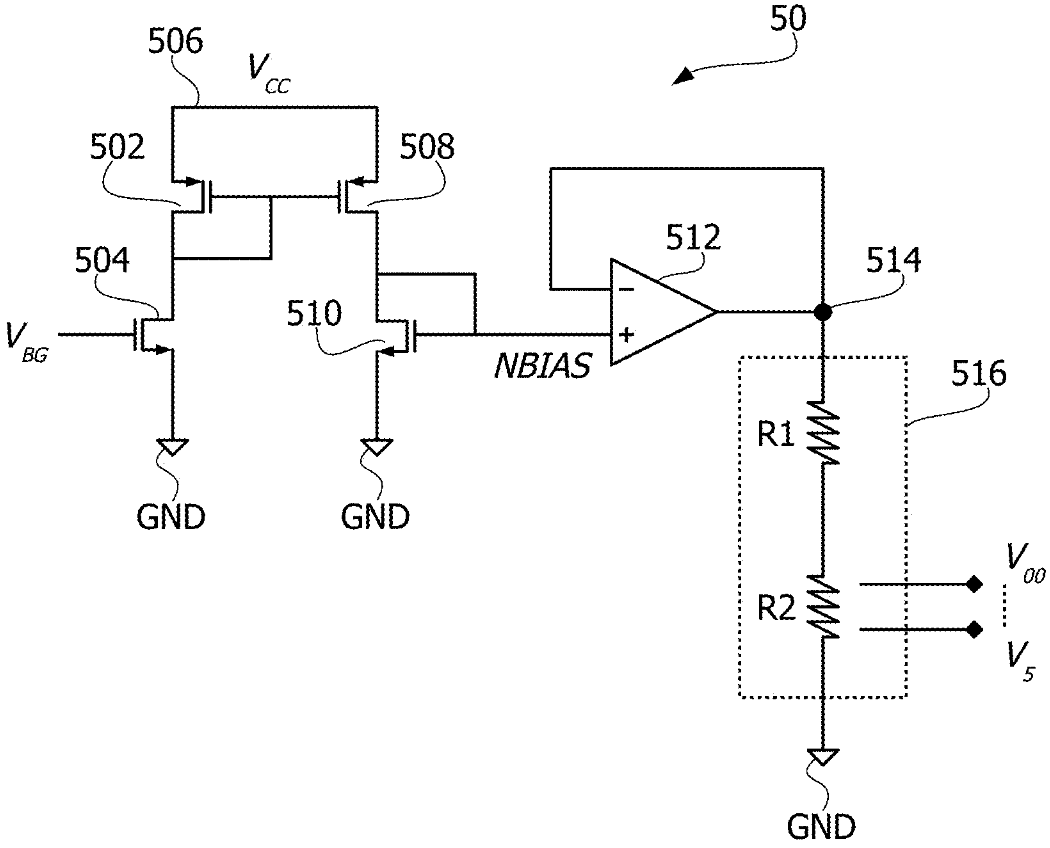
FIG. 5 is a circuit diagram exemplary of a compensation circuit for a current-steering digital-to-analog converter (IDAC) according to one or more embodiments of the present description.

FIG. 5 is a circuit diagram exemplary of a possible implementation of a compensation circuit 50 configured to produce one or more compensation signals $V_5, \ldots, V_0, V_{00}$ for a W-2W IDAC circuit 20 as exemplified in FIG. 4, where the compensation signals depend on temperature.

Figure 6:
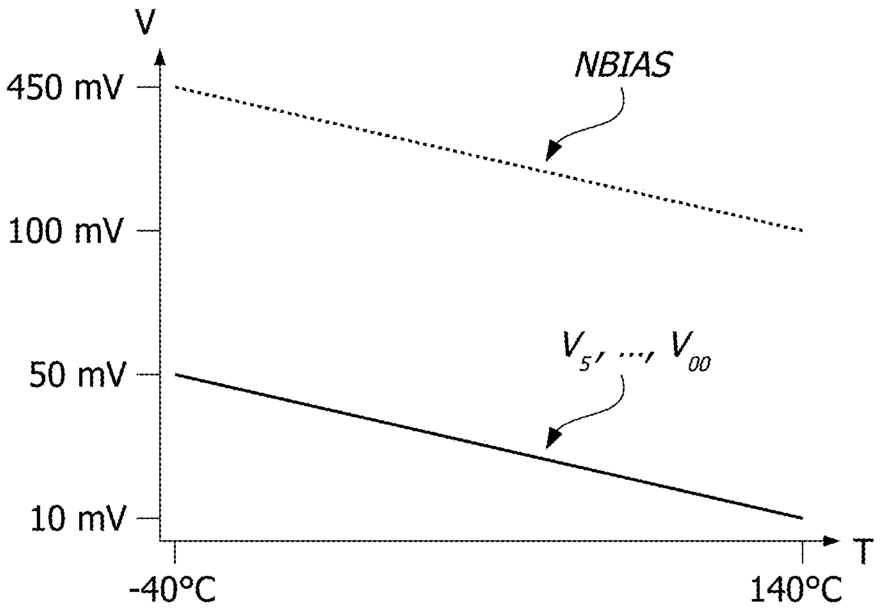
FIG. 6 is a voltage-temperature diagram exemplary of the temperature dependence of one or more compensation signals produced by the compensation circuit of FIG. 5.

A compensation circuit 50 may comprise an inversely proportional-to-absolute-temperature (IPTAT) current generator arrangement configured to produce a voltage signal NBIAS that decreases (e.g., linearly) as a function of temperature, as exemplified in the voltage-temperature diagrams of FIG. 6. In particular, the compensation circuit 50 may comprise a p-channel MOS transistor 502 arranged in series with an n-channel MOS transistor 504 between a supply voltage node 506 that provides the supply voltage $V_{CC}$ and the reference voltage node GND. Transistor 504 may have a source terminal coupled to the reference voltage node GND, a drain terminal coupled to the drain terminal of transistor 502, and a gate terminal configured to receive a bandgap reference voltage VBG.

Transistor 502 may have a source terminal coupled to the supply voltage node 506, a drain terminal coupled to the drain terminal of transistor 504, and a gate terminal coupled to its drain terminal (i.e., it may be in a diode connection configuration). The compensation circuit 50 may further comprise a p-channel MOS transistor 508 arranged in series with an n-channel MOS transistor 510 between the supply voltage node 506 and the reference voltage node GND. Transistor 508 may have a source terminal coupled to the supply voltage node 506, a drain terminal coupled to the drain terminal of transistor 510, and a gate terminal coupled to the gate terminal of transistor 502 (e.g., in a current mirror configuration with transistor 502). Transistor 510 may have a source terminal coupled to the reference voltage node GND, a drain terminal coupled to the drain terminal of transistor 508, and a gate terminal coupled to the drain terminal (i.e., it may be in a diode connection configuration). A signal NBIAS having a temperature dependence as exemplified in FIG. 6 (e.g., linear) may thus be produced at the gate terminal of transistor 510.

The compensation circuit 50 may further comprise a voltage buffer circuit 512 having a non-inverting input configured to receive signal NBIAS (e.g., coupled to the gate terminal of transistor 510) and an inverting input coupled to the output node 514 of the voltage buffer 512. The buffer 512 may include or consist of an operational amplifier. A voltage divider circuit 516 (e.g., a resistive voltage divider or resistive ladder) may be coupled between the output node 514 of the voltage buffer 512 and the reference voltage node GND. The voltage buffer 512 thus de-couples the gate and drain terminals of transistor 510 (NBIAS node) from the voltage divider circuit 516 and provides a current to the voltage divider circuit 516.

One or more compensation signals $V_5, \ldots, V_0, V_{00}$ may thus be provided at one or more intermediate nodes of the resistive divider circuit 516, to be provided to the bulk terminals of the slave transistors $M_5, \ldots, M_0, T_1$, To in the W-2W IDAC circuit 20 as exemplified in FIG. 4. In particular, voltage $V_{00}$ intended for biasing the bulk of transistors $T_1$ and $T_0$ may be higher than voltage $V_0$ intended for biasing the bulk of transistor $M_0$, voltage $V_0$ may be higher than voltage $V_1$ intended for biasing the bulk of transistor $M_1$, voltage $V_1$ may be higher than voltage $V_2$ intended for biasing the bulk of transistor $M_2$, and so on until voltage $V_5$ intended for biasing the bulk of transistor $M_5$ being the lowest one.

It should be understood that compensation circuit 50 shown in FIG. 5 is just one example of many possible circuits that could be used to generate compensation signals $V_5, \ldots, V_0, V_{00}$. In alternative embodiments, other IPTAT current and voltage generators known in the art may be used to generate an IPTAT voltage or current and provide corresponding scaled outputs.

Therefore, in a compensation circuit 50 as exemplified in FIG. 5, an IPTAT generator may be used to generate signal NBIAS having a temperature-dependent profile as exemplified in FIG. 6. At low temperatures (e.g., −40° C.) the IPTAT current flowing through transistors 502 and 504 is higher than the current flowing at high temperatures (e.g., 140° C.). As a result, the voltage signal NBIAS is higher at −40° C. and lower at 140° C. as well (e.g., signal NBIAS may linearly decrease with respect to temperature). By changing the channel size (width W and length L) of transistor 510, the slope of signal NBIAS (i.e., its coefficient of temperature dependence) can be changed. Signal NBIAS is replicated at the output node 514 of the voltage buffer circuit 512, which supplies the voltage divider 516 to produce the desired compensation signal(s) $V_5, \ldots, V_0, V_{00}$. For instance, in case the same compensation signal is applied to all the slave transistors $M_5, \ldots, M_0, T_1$, To, it could be produced at an intermediate point between resistors R1 and R2 of the divider circuit 516.

In one or more embodiments, applying one or more temperature-dependent compensation signals $V_5, \ldots, V_0, V_{00}$ to the bulk (or body) terminals of slave transistors $M_5, \ldots, M_0, T_1$, To may thus facilitate compensating the body effect of those transistors, thereby allowing the production of current pulses having the (linear) behavior expected for programming the memory cells of a phase-change memory while taking advantage of the silicon low area of the W-2W IDAC circuit architecture.

Without prejudice to the underlying principles, the details and embodiments may vary, even significantly, with respect to what has been described by way of example only, without departing from the extent of protection.

The extent of protection is determined by the annexed claims.

What is claimed is:

1. A circuit, comprising:

a plurality of ordered mirroring MOS transistors having respective gate terminals connected to a current reference node and respective drain terminals alternatively couplable either to a first current node or to a second current node as a function of a plurality of respective ordered control signals, wherein a first mirroring MOS transistor in the plurality of ordered mirroring MOS transistors has a source terminal directly connected to a reference voltage node; and a plurality of current control MOS transistors having respective gate terminals connected to the current reference node, wherein each current control MOS transistor is arranged between source terminals of two consecutive mirroring MOS transistors in the plurality of ordered mirroring MOS transistors, wherein mirroring MOS transistors of the plurality of ordered mirroring MOS transistors whose source terminals are not directly connected to the reference voltage node have respective bulk terminals configured to receive one or more compensation signals, the one or more compensation signals having respective values that decrease with increasing temperature.

2. The circuit of claim 1, wherein the one or more compensation signals are linearly dependent on temperature.

3. The circuit of claim 1, further comprising a compensation circuit configured to produce the one or more compensation signals, the compensation circuit comprising:

an inversely proportional-to-absolute-temperature current generator arrangement configured to produce a compensation voltage signal that decreases linearly as a function of increasing temperature;

a voltage divider circuit; and a buffer stage configured to supply the compensation voltage signal to the voltage divider circuit, wherein the one or more compensation signals are produced at one or more intermediate nodes of the voltage divider circuit.

4. The circuit of claim 3, wherein the buffer stage comprises an amplifier circuit having an output terminal coupled to the voltage divider circuit, a non-inverting input terminal configured to receive the compensation voltage signal, and an inverting input terminal coupled to its output terminal.

5. The circuit of claim 1, wherein the mirroring MOS transistors of the plurality of ordered mirroring MOS transistors whose source terminals are not directly connected to the reference voltage node include triple-well n-channel MOS transistors.

6. The circuit of claim 1, wherein a source terminal of a last mirroring MOS transistor in the plurality of ordered mirroring MOS transistors is directly connected to a source terminal of a second-to-last mirroring MOS transistor in the plurality of ordered mirroring MOS transistors.

7. The circuit of claim 6, wherein the last mirroring MOS transistor and the second-to-last mirroring MOS transistor have respective bulk terminals configured to receive a same compensation signal.

8. The circuit of claim 1, wherein a drain terminal of a last mirroring MOS transistor in the plurality of ordered mirroring MOS transistors and a drain terminal of a second-to-last mirroring MOS transistor in the plurality of ordered mirroring MOS transistors are steadily coupled to the second current node.

9. The circuit of claim 1, wherein the drain terminals of the plurality of ordered mirroring MOS transistors are alternatively couplable to the first current node or to the second current node via respective switches activatable as a function of the respective ordered control signals.

10. The circuit of claim 1, further comprising a first output diode-connected MOS transistor having a drain terminal connected to the first current node and a source terminal connected to a supply voltage node, and a second output diode-connected MOS transistor having a drain terminal connected to the second current node and a source terminal connected to the supply voltage node.

11. The circuit of claim 1, wherein each of the plurality of ordered mirroring MOS transistors has a first width-to-length ratio, and each of the plurality of current control MOS transistors has a second width-to-length ratio that is twice the first width-to-length ratio.

12. A digital-to-analog converter (DAC) comprising:

a W-2W current mirror comprising a first plurality of MOS transistors and a second plurality of MOS transistors, wherein ones of the second plurality of MOS transistors are coupled between adjacent ones of the first plurality of MOS transistors; and a bulk bias generator having a plurality of output nodes coupled to corresponding bulk nodes of the first plurality of MOS transistors, wherein the plurality of output nodes are configured to provide voltages that are inversely proportional to temperature.

13. The DAC of claim 12, further comprising an output coupling network coupled to output nodes of the first plurality of MOS transistors, the output coupling network configured to selectively couple the output nodes of the first plurality of MOS transistors to an output node of the DAC in accordance with a digital DAC input word.

14. The DAC of claim 12, wherein the bulk bias generator comprises:

a voltage generator configured to provide an inversely proportional to a temperature reference voltage; and a resistor ladder coupled to an output of the voltage generator, the resistor ladder comprising a plurality of taps, wherein output nodes of the plurality of output nodes of the bulk bias generator are coupled to corresponding taps of the plurality of taps.

15. The DAC of claim 14, wherein the voltage generator comprises:

an input MOS transistor having a gate coupled to a reference voltage generator;

a diode connected MOS transistor having:

a current mirror having an input coupled to an output node of the input MOS transistor and an output node coupled to a gate and drain of the diode connected MOS transistor; and a voltage buffer coupled between the gate and drain of the diode connected MOS transistor and the resistor ladder.

16. The DAC of claim 12, wherein voltage levels of the voltages provided by the bulk bias generator and a temperature coefficient of the voltages provided by the bulk bias generator are selected to increase a linear behavior of the W-2W current mirror.

17. The DAC of claim 12, wherein each of the first plurality of MOS transistors has a first width-to-length ratio, and each of the second plurality of MOS transistors has a second width-to-length ratio that is twice the first width-to-length ratio.

18. A method of operating a current digital-to-analog converter (IDAC) that includes a W-2W current mirror comprising a first plurality of MOS transistors and a second plurality of MOS transistors, wherein ones of the second plurality of MOS transistors are coupled between adjacent ones of the first plurality of MOS transistors, the method comprising:

biasing bulk nodes of the first plurality of MOS transistors with a corresponding plurality of inversely proportional to temperature bias voltages.

19. The method of claim 18, further comprising:

receiving a DAC input word; and selecting output branches of the W-2W current mirror in accordance with the DAC input word.

20. The method of claim 18, wherein biasing the bulk nodes comprises:

generating a first bias voltage that is inversely proportional to temperature; and applying the first bias voltage to a resistor ladder.

* * * * *